United States Patent [19]

Sangyoji et al.

[11] Patent Number: 5,169,677
[45] Date of Patent: Dec. 8, 1992

[54] METHOD FOR FORMING LENS AT END PORTION OF OPTICAL APPARATUS, OPTICAL SIGNAL TRANSMISSION APPARATUS, AND OPTICAL INFORMATION PROCESSING APPARATUS

[75] Inventors: Kazuo Sangyoji; Mitsuru Ohta; Yoshiyuki Ban, all of Nagoya, Japan

[73] Assignee: Brother Kogyo Kabushiki Kaisha, Aichi, Japan

[21] Appl. No.: 604,145

[22] Filed: Oct. 26, 1990

[51] Int. Cl.⁵ ............................................. B05D 3/06
[52] U.S. Cl. .................................... 427/581; 264/1.4; 264/1.5; 385/33; 385/35; 427/163; 427/169; 427/513; 359/642
[58] Field of Search ............... 350/417; 385/33, 35; 427/53.1, 54.1, 163, 169; 264/1.4, 1.5

[56] References Cited

U.S. PATENT DOCUMENTS 4,067,937  1/1978  Unno et al. ............................ 264/65
4,118,270 10/1978  Pan et al. ........................... 264/65 K
4,125,644 11/1978  Ketley et al. ................... 427/54.1 X
4,324,575  4/1982  Levy ................................. 427/163 X
4,913,859  4/1990  Overton et al. ................. 427/163 X
4,948,214  8/1990  Hamblen ............................ 385/33 X
5,028,109  7/1991  Lawandy ......................... 430/170 X

*Primary Examiner*—Michael Lusignan
*Attorney, Agent, or Firm*—Kane, Dalsimer, Sullivan, Kurucz, Levy, Eisele and Richard

[57] ABSTRACT

A method for forming a lens at an end portion of an optical apparatus, such as an optical fiber assembly, a fiber optical CRT or an LED array, which method comprises a dipping step wherein the end portion of the optical apparatus is dipped into an unsolidified photo-setting resin and a lighting step wherein the photo-setting resin is solidified according to an intensity distribution of the light outputted from the optical apparatus. Further, an optical information processing apparatus and an optical signal transmission apparatus have a lens array formed by the above method.

11 Claims, 14 Drawing Sheets

METHOD FOR FORMING LENS AT END PORTION OF OPTICAL APPARATUS, OPTICAL SIGNAL TRANSMISSION APPARATUS, AND OPTICAL INFORMATION PROCESSING APPARATUS

BACKGROUND OF THE INVENTION

The present invention relates to a method for forming a lens at an end portion of an optical apparatus, a light transmission apparatus having a plurality of lenses at its end portion for transmitting a light and an optical information processing apparatus including a lens array at its end portion for processing an optical information.

In the first place, conventionally, there has been known a system in which a laser beam printer is used for forming an electrostatic latent image on a photosensitive medium.

Such a laser printer is provided with, for example, an optical scanning device. This device is provided with a cylindrical rotary head and an optical fiber array disposed adjacent to the rotary head.

Then, a light source is disposed at a position of the peripheral edge portion of the aforementioned rotary head. A motor is connected to the rotary head. When the rotary head is rotated by means of the motor, a light emitted from the light source is incident at its input end of the optical fiber array in order and is then emitted from its output end.

In this case, since a light emitted from the output end diffuses or spreads, two light spots adjacent to each other are superimposed, so that a clear image cannot be formed on a photosensitive drum.

In the next place, conventionally, since an optical signal transmission means of a printer, a copy machine or the like is provided with an optical fiber, a SELFOC lens, a laser light source and so on. The SELFOC lens is one of the gradient index lenses. In the optical fiber, an inputted light can be outputted at the other end after passing through the optical fiber. However, since the light diffuses in the air at the distal end of the optical fiber, a record medium must be placed close to the distal end of the optical fiber when the exposure on a photosensitive medium carried out by the optical fiber is performed. In the SELFOC lens array, a plurality of lenses are arranged within a solid resin, so that the outputted light focuses at a certain distance. However, since the light inputted into one SELFOC lens is very little in comparison with the amount of light emitted from a light source which provides an optical information, a transmission efficiency in a light intensity is very low. A laser light is a good means as the light transmission means except costs and maintenance of a light source and the control device thereof.

In the case that a fiber optical CRT having the optical fibers in front of the CRT is used as the light transmission means for providing an image information on the photosensitive recording medium, an electric signal of an image information is fed to the CRT in the form of an electron beam so as to pass through a Braun tube. Then, a fluorescent material applied to the front surface of the CRT is irradiated with a light beam so as to emit a light. Thereupon, the optical fibers are disposed in front of the CRT and the image information is outputted from the distal ends of the optical fibers. The fiber optic CRT is adapted to record the image information from the back surface of the photosensitive recording medium, namely in contact with a base member to which the photosensitive substance is applied. However, since a light outputted from the optical fiber diffuses throughout the medium, the light diffuses corresponding to a thickness of the base member of the photosensitive recording medium, so that the intensity of a light reaching the photosensitive substance lowers. Therefore, an image thus obtained becomes unclear.

Further, conventionally, in the case of a copy machine employing, for example, an LED array and the SELFOC lens as an optical information processing apparatus, an information is supplied as an electric signal to the LED array so that the LED can emit a light according to the electric signal. The photosensitive material is exposed by a light from the light-emitting portion through the SELFOC lens as a refractive index distribution type rod lens. A photosensitive component material such as selenium, silver salt, dry silver and the like is applied to the photosensitive material so that the information can be recorded in respective manners or modes according to the information to be recorded. The aforementioned LED array is composed of a large number of small light-emitting portions arranged in a line on a substrate having a plurality of electrodes.

In the case of the optical information processing apparatus employing the optical fibers as the optical signal transmission apparatus, the photosensitive material is exposed by a light from a light emission member through the optical fibers.

There is, however, the following problem associated with the aforementioned copy machine. That is, since a large occupied space is required for the copy machine because of a length of the SELFOC lens as an image throwing lens, the overall apparatus becomes large corresponding to the length thereof.

When the optical fibers are employed, there is the following problem. That is, since a light emitted from the optical fiber diffuses throughout a medium, the light spreads over the thickness of a base member of the photosensitive medium so that the intensity of the light reaching the photosensitive medium is lowered and an image thus obtained is dim.

It is an object of this invention to provide a method for forming at an end portion of an optical apparatus which is low in cost and high in productivity and which can provide a clear image by forming a lens at the distal end of an optical fiber.

It is another object of this invention to provide a optical signal transmission apparatus in which an outputted light having an optical information can reach a photosensitive substance from the distal ends of optical fibers of a fiber optic CRT without diffusing in a certain medium.

It is still another object to provide a clear image by condensing a light through a microlens provided for a light emission member thereof and make the overall apparatus smaller in dimension.

SUMMARY OF THE INVENTION

According to one aspect of the present invention, there is provided a method for forming a lens at an end portion of an optical fiber, which comprises the steps of:

dipping one end of the optical fiber into an unsolidified photo-setting resin; and solidifying the photo-setting resin adjacent to said one end of the optical fiber according to an intensity distribution of light which is incident at the other end thereof and outputted from said one end to form a lens at said one end of the optical fiber.

According to another aspect of the present invention, there is provided a method for forming a lense array at an end portion of an LED array, which comprises the steps of;

dipping the end portion of the LED array into an unsolidified photo-setting resin;

solidifying the photo-setting resin adjacent to said one end of the optical fiber according to an intensity distribution of light which is incident at the LED array and outputted from said end portion thereof to form the lens array at said end portion of the LED array.

According to still another aspect of the present invention, there is provided an optical signal transmission apparatus including a fiber optic CRT in which at least one optical fiber is optically connected to an end of the CRT, which comprises a lens formed at an end portion of said optical fiber.

According to still another aspect of the present invention, there is provided an optical information processing apparatus for exposing a photo-sensitive material with a light emitted from a light emission member or a light transmitted by means of an optical signal transmission apparatus, which comprises at least one microlens is provided in said light emission member or in said optical signal transmission apparatus.

Further objects, features and other aspects of this invention will be understood from the following detailed description of the preferred embodiments of this invention with reference to the drawings.

BRIEF DESCRIPTION OF THE DRAWINGS

In the accompanying drawing.

DESCRIPTION OF THE PREFERRED EMBODIMENTS

Prior to the explanation of the first embodiment, a conventional optical scanning device will be explained with reference to FIGS. 1 through 3 hereinafter.

Figure 1:
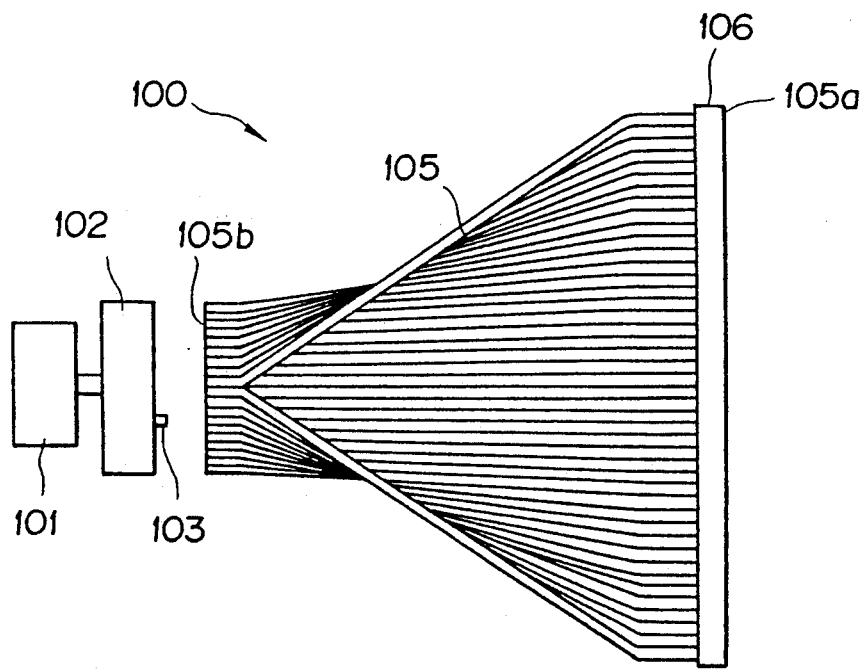
FIG. 1 is a plan view of an optical scanning device in a conventional laser beam printer.

As shown in FIG. 1, a laser printer is provided with, for example, an optical scanning device 100. This device 100 is provided with a cylindrical rotary head 102 and an optical fiber array 105 which spreads from a cylindrical configuration to a fan-configuration and has a final end arranged in one line.

Then, a light source 103 is disposed at a position of the peripheral edge portion of the aforementioned rotary head 102. On one hand, a motor 101 is connected to the back end portion of the rotary head 102. When the rotary head 102 is rotated by means of the motor 101, a light emitted from the light source 103 is inputted to the input end 105b of the optical fiber array 105 in order and then is outputted from the output end 105a thereof.

Figure 2:
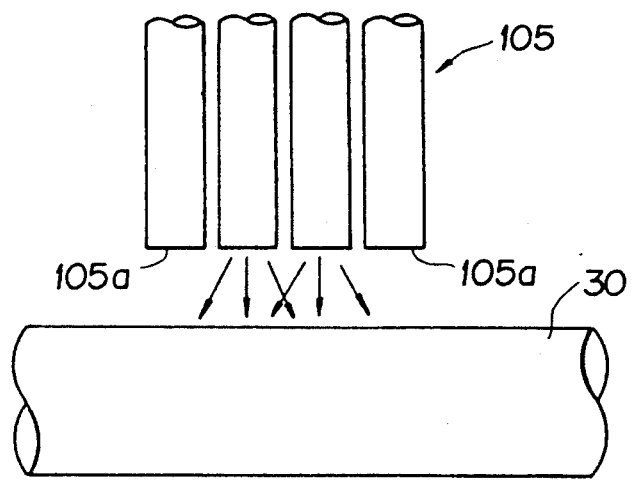
FIG. 2 is a view showing a condition in which a photosensitive drum is exposed by use of a conventional optical fiber array without a lens.

As shown in FIG. 2, a plurality of predetermined dots are formed on a photosensitive drum 30 by the light emitted from the output end 105a.

Figure 3:
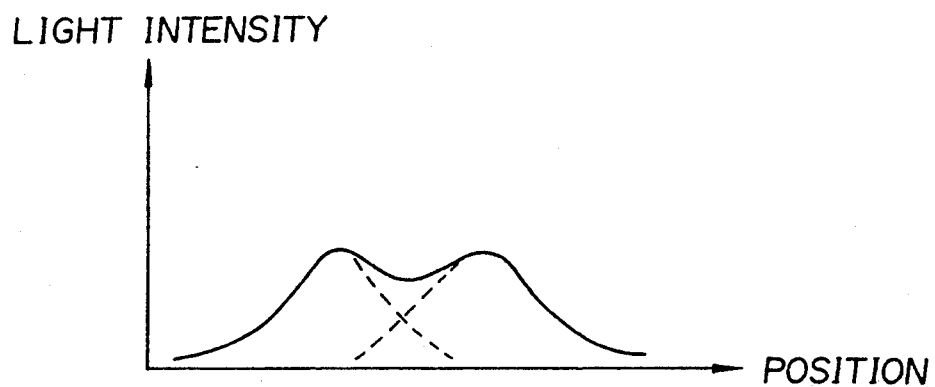
FIG. 3 is a view showing a light intensity distribution diagram of the optical fiber array in FIG. 2.

In this case, since the light emitted from the output end 105a diffuses at the flat output end 105a as the end of the optical fiber, for example, as shown in FIG. 3, a light intensity distribution in which two adjacent lights are superimposed to prevent the formation of a clear image on the photosensitive drum 30.

In order to solve such a problem, a distance between the output end 105a and the photosensitive drum 30 can be shortened. But, the distance is limited due to a problem of a machine accuracy and so on. Therefore, conventionally, for example, the distal end of the optical fiber is ground in a convex configuration by a grinder to as to form a lens in the distal end of the optical fiber.

FIRST EMBODIMENT

A first embodiment of the present invention concerning a method for forming a lens at an end portion of an optical apparatus will be explained with reference to FIGS. 4 through 10 hereinafter.

Figure 4:
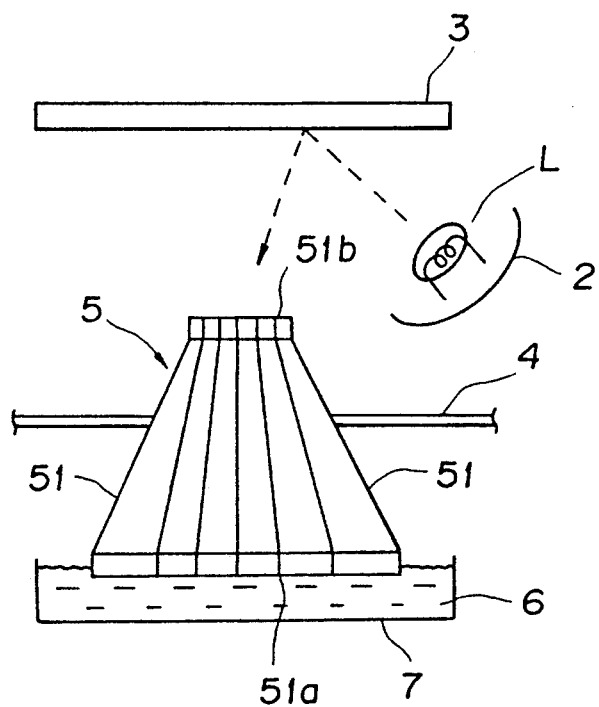
FIG. 4 is a schematic view showing on embodiment of an apparatus, according to this invention, to be directly used for a method for forming a lens at an end portion of an optical fiber.
Figure 5:
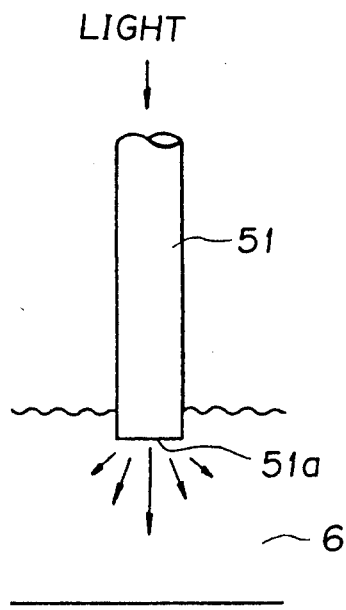
FIG. 5 is a schematic view showing a condition in which light is emitted for the distal end of the optical fiber dipped into a photo-setting resin.
Figure 6:
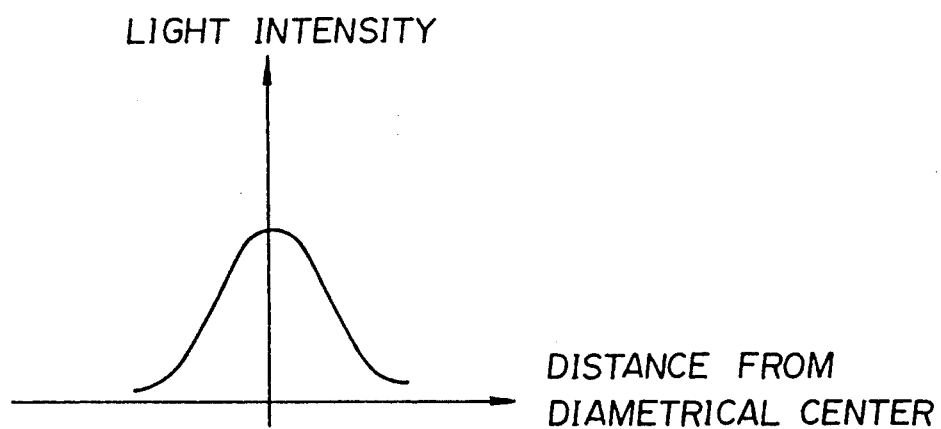
FIG. 6 is a view showing a light intensity distribution diagram of light emission from the distal end of the optical fiber.

FIG. 4 is a view showing one example of an apparatus directly used for carrying out a method of the first embodiment of the present invention.

The apparatus is provided with a container 7 on its lower side for storing an unsolidified photo-setting or photo-curing resin 6 therein, a diffusing plate 3 on the upper side of the container 7, a lump L for emitting a light to one end (referred to as an input end 51b hereinafter) of an optical fiber array 5 as a light source of a diffused light from the diffusing plate 3, a reflection plate 2 for collecting the light emitted from the lump L, and a shielding plate 4 for shielding an unnecessary light.

A lens is formed at the optical fiber by the method of the first embodiment. In FIG. 4, the optical fiber array 5 composed of a plurality of bundles of optical fibers 51 is arranged in a predetermined configuration. Open ends (referred to as an output end 51a hereinafter) of these optical fibers 51 are dipped into the unsolidified resin 6.

The photo-setting resin stored within the container 7 is prepared by mixing, for example, diallyl ketone derivative such as benzophenone, Michler's ketone, benzoyl methyl ether, isopropylxanthone, isopropyl-thioxanthone and the like, benzyl alkyl ether and ketocumulene compound as a polymerization initiator with polyhydric alcohol ethylene unsaturated acid ester such as ethylene glycol dimethacrylate, triethylene glycol dimethacrylate, trimethyl propane triacylate, trimethylal propane triacrylate, pentaerythritol triacrylate, pentaerythritol trimetacrylate and the like.

Firstly, the lump L shown in FIG. 4 is kept off, and one end of the optical fiber array 5 bundled in a predetermined configuration is dipped into the photo-setting resin 6.

After that, the lump L is put on for a certain time. When the lump L is put on, the light emitted from the lump L is once collected by a reflection plate 2 and then reflected at random. The diffused light is inputted to the other end (referred to as an input ends 51b) of the optical fiber array 5.

The inputted light transmits through the respective optical fibers 51 and is emitted from the output ends 51a (dipped into the photo-setting resin) of the optical fibers.

When each of individual optical fibers 51 of the optical fiber array 5 (refer to FIG. 5) is observed, the light inputted from the input end 51b thereof is adapted to be outputted from the output end 51a thereof. The intensity of the outputted light is strong near the center of the diameter of the optical fiber 51 and becomes weaker gradually as getting nearer to the periphery of the diameter as shown, for example, in FIG. 6.

Figure 7:
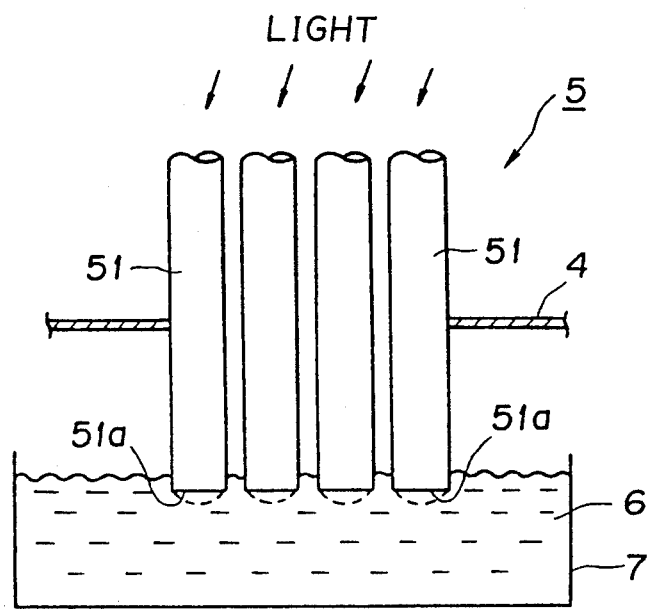
FIG. 7 is an enlarged view of an output end of the optical fiber dipped into a photo-setting resin.

Therefore, the photo-setting or curing resin 6 starts to solidify in accordance to the light intensity distribution and finally provides a lens having a convex on its one side as indicated by a dotted line in FIG. 7.

Figure 8:
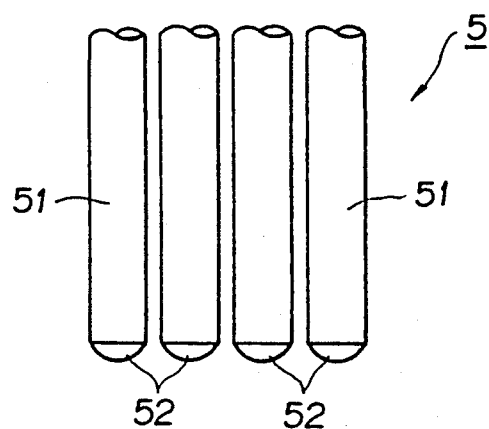
FIG. 8 is an enlarged view of the lens formed of the photo-setting resin solidified at the distal end of the optical fiber.

As shown in FIG. 8, the optical fiber array 5 is pulled out of the photo-setting resin 6 within the container 7, after a solidification has been almost completed, and then washed away sufficiently with an organic solvent such as xylene.

After that, further a sufficient light is applied to the solidified resin portion (the lens portion 52) so as to completely solidify the lens portion 52.

Figure 9:
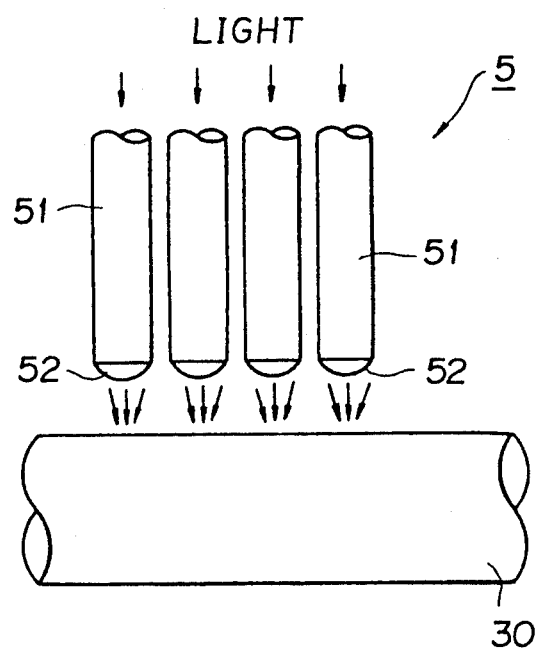
FIG. 9 is a view showing a condition in which a photosensitive drum is exposed through the optical fiber provided with the lens formed.
Figure 10:
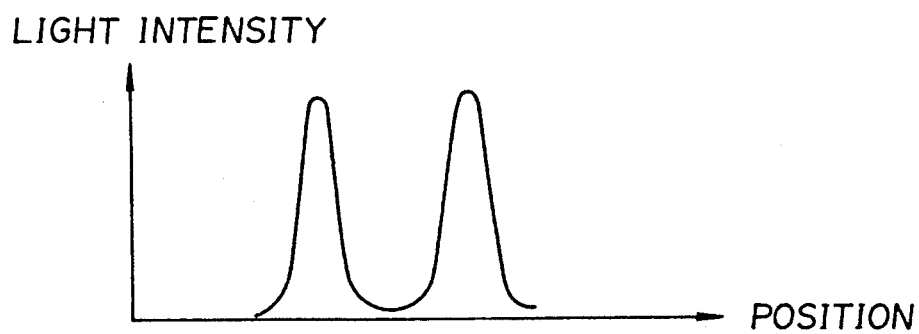
FIG. 10 is a view showing a light intensity distribution diagram of the optical fiber in FIG. 9.

When an optical recording is performed by use of the optical fiber having the lens portion 52 solidified according to such a method as shown in FIG. 9, the light outputted from the output end 51a of each of the optical fibers 51 is condensed by the lens portion 52. Therefore, as shown in FIG. 10, the light intensity distribution on the photosensitive drum 30 becomes very sharp, and, accordingly, the image to be outputted also becomes very sharp.

Incidentally, the photosensitive drum 30 is previously charged with an electricity by an unillustrated charger so that a latent image can be formed when it is exposed.

According to the first embodiment having the above-mentioned construction, the light emitted from the light source is inputted into one end of the optical fiber array 5, and the inputted light is guided by the optical fiber array 5 so as to reach the other end thereof to be outputted from the other end in a state wherein the other end of the optical fiber array 5 outputting the light is dipped into the unsolidified photo-setting resin. The photo-setting resin is solidified according to the light intensity distribution of the outputted light so as to form a lens at the distal end of each optical fiber 51.

A clearly understood from the above detailed description, according to the first embodiment, a lens can be efficiently formed to the distal end of an optical fiber 51.

That is, in comparison with the conventional grinding method, the lens can be formed very readily and rapidly. Additionally, even after the optical fibers have been arranged in a predetermined configuration (even after the formation of the optical fiber array), the lenses can be readily formed.

SECOND EMBODIMENT

Then, a second embodiment of the present invention concerning a method for forming a lens at an end portion of an optical apparatus will be explained with reference to FIGS. 11 through 14 hereinafter.

Figure 11:
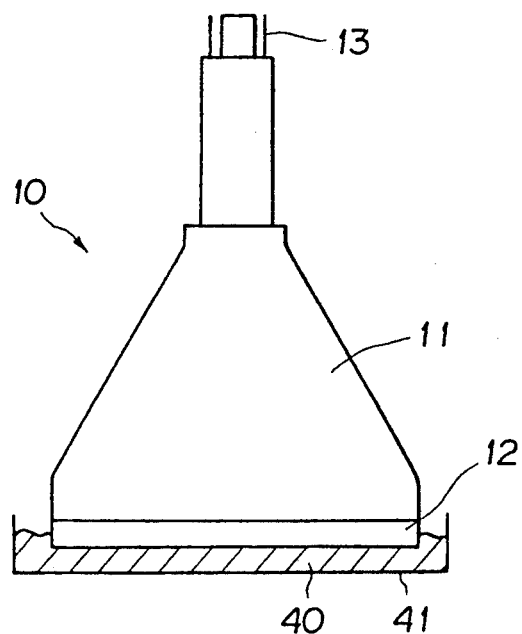
FIG. 11 is a view schematically showing a method for forming a lens at an end potion of an optical signal transmission apparatus.

FIG. 11 is a schematic view showing the second embodiment of this invention.

As shown in FIG. 11, an optical signal transmission apparatus 10 comprises a CRT section 11 and an optical fiber section 12.

Figure 12:
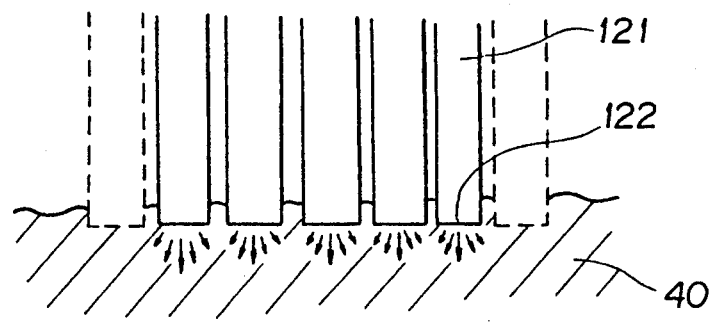
FIG. 12 is a view showing a state of a light emitted from the distal end of the optical fiber.

As shown in FIG. 12, the distal end portion 122 of each of a plurality of optical fibers 121 forming the optical fiber section 12 is dipped into a container 41 storing a photo-setting resin 40 therein. An electric signal is supplied from electric signal input section 13 so that a light is emitted from the overall portion of the distal end portion 122 of each optical fiber 121. The light emitted from the distal end portion 122 of the optical fiber 121 serves to gradually solidify the photo-setting resin 40 from a position near the distal end portion 122 of the optical fiber 121 so as to form a round distal end portion of the optical fiber 121 as a lens. Since the light passing through the optical fiber 121 is strong in light intensity at the central portion of the optical fiber 121 and becomes weaker in light intensity as going away from the central portion thereof, the photo-setting resin 40 to be solidified at the distal end portion 122 of the optical fiber becomes thick at the central portion of the optical fiber 121 and becomes gradually thinner as going to the peripheral portion thereof. Thus, the distal end portion of each optical fiber 121 is formed as shown in FIG. 8.

Then, the components of the photo-setting resin will be explained hereinafter.

As a photopolymeric resin component, photo polymeric mononmer, photo polymerization initiator and sensitizer are mixed. As the photopolymeric monomer, a compound having an ethylene unsaturated linkage is preferably used and ester acrylalte of polyhydric alcohol, unsaturated ester of polycarboxylic acid, ester acrylate, unsaturated acid amide, monomer having acetylene unsaturated base and the like can be used. Among them, the ester acrylate is most preferable in transparency, in handling easiness and in sensitivity. As the photopolymeric initiator and the sensitizer, carbonyl compound, azo compound, organometallic compound, metallic carbonyl compound and so on are preferable. Among them, the carbonyl compound having ketone base is most preferable. When these photopolymeric monomer, the photo polymerization initiator and the sensitizer are mixed, not only one kind of them but also two and more kinds of them may be mixed.

Figure 13A:
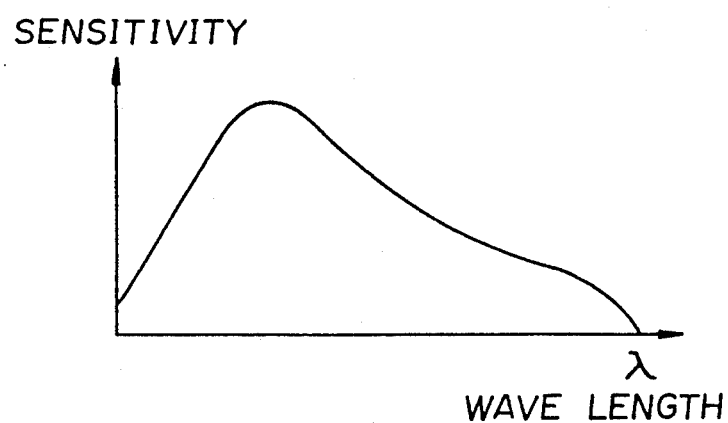
FIG. 13(a) is a view showing a sensitivity characteristic of a photo-setting resin.
Figure 13B:
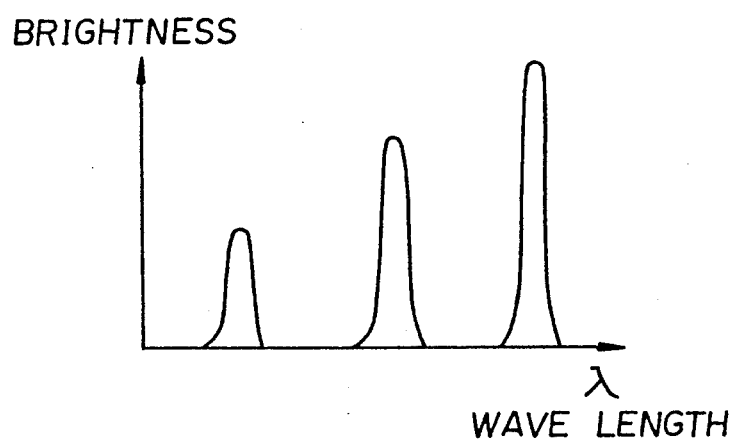
FIG. 13(b) is a view showing a relation between a wave length of the photo-setting resin and a brightness of a fluorescent material.

The photo-setting resin 40 may have a different sensitivity with respect to each wave length (refer to FIG. 13(a)). Such a case, it is possible to adapt the brightness of a fluorescent material to the sensitivity of the photo-setting resin by controlling the strength of the electron beam to be applied to the fluorescent material (refer to FIG. 13(b)).

Figure 14A:
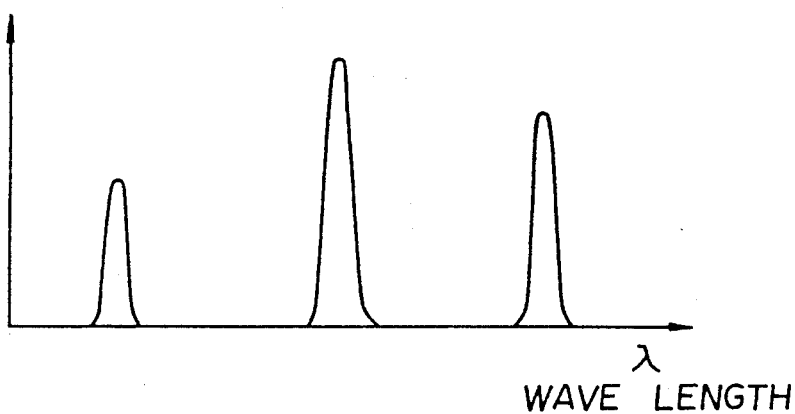
FIG. 14(a) is a view showing a relation between the wave length and the brightness of the fluorescent material.
Figure 14B:
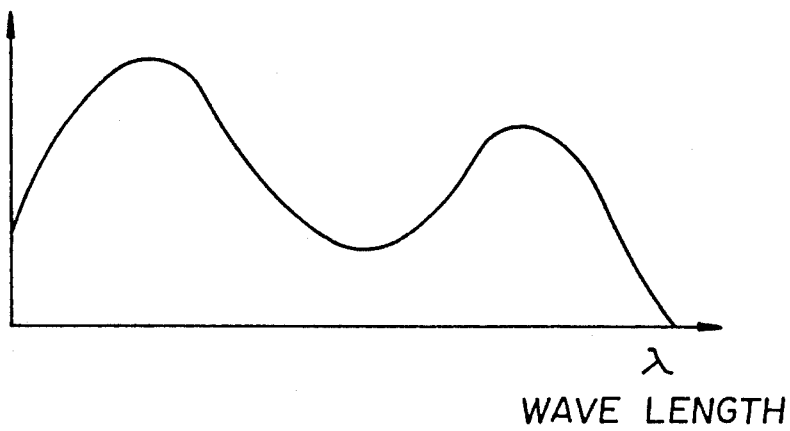
FIG. 14(b) is a view showing a sensitivity characteristic of a photo-setting resin.

Further, when the brightness of the fluorescent material differs with respect to each wave length (refer to FIG. 14(a)), it is possible to adapt the sensitivity of the photo-setting resin to the brightness of the fluorescent material (refer to FIG. 14(b)).

According to the second embodiment having the above-mentioned construction, one of R, G and B electric signals is supplied to the CRT so as to make the fluorescent material on the front surface of the CRT luminous and to input the light to the optical fibers 121. The photo-setting resin applied to the distal end of each optical fiber 121 is exposed by the light supplied through optical fiber so that a lens ca be formed at the end 122 of the optical fiber 121. Since the light intensity distribution of the optical fiber 121 becomes greater as getting nearer to its center and less as getting nearer to its peripheral portion, the photo-setting resin is shaped as a lens whose thickness becomes thicker toward its center and thinner toward the peripheral portion of the optical fiber 121.

THIRD EMBODIMENT

Then, a third embodiment of the present invention concerning a method for forming a lens at an end portion of an optical apparatus will be explained with reference to FIGS. 15(a) (b) and (c).

Figure 15A:
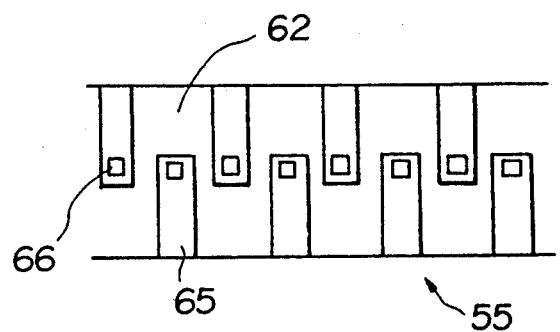
FIGS. 15(a),(b) and (c) are schematic views showing a method for forming a lens array at a distal end portion of the LED array; respectively.

FIGS. 15(a) (b) and (c) are views showing a method for forming lenses at the distal end portion of an LED array, respectively.

As shown in FIG. 15(a), the LED array 55 as a light emission device has a plurality of electrodes 65 arranged in a zigzag state on a GaAs base member 62 and the distal end portion 66 of each electrode 65 as a light emission member is formed on the respective electrodes 65.

Figure 15B:
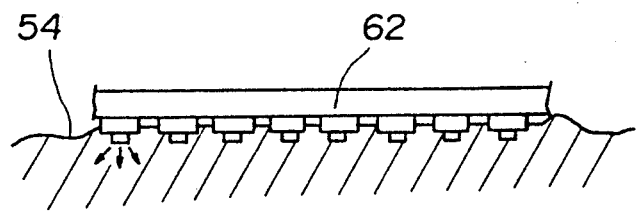
Figure 15C:
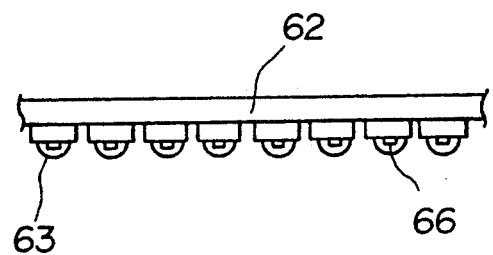

As shown win FIGS. 15(a) through 15(c), the distal end portions 66 of the electrodes 65 (light emission member) are dipped into a container storing a photo-setting resin 54. An electric signal is supplied from the head control circuit 64 (FIG. 21) so that a light can be emitted from the allover surface of the distal end portion 66 of each electrode 65. When the photo-setting resin 54 is solidified gradually from a position near the distal end portion 66 of the electrode 65 by the light emitted from the distal end portion 66 of the light emission member, the photo-setting resin 54 sticks to the surrounding of the distal end portion 66 of the light emission member so as to form a curved resin piece. Since the light emitted from the distal end portion 66 of the light emission member is strong in light intensity at the central portion thereof and becomes weaker in light intensity as going away from its center, the amount of the photo-setting resin 54 to be solidified at the distal end portion 66 of the light emission member is much at the central portion of the distal end potion 66 of the light emission member and becomes less gradually as getting nearer to its peripheral portion. In this way, the resin piece formed at the distal end portion 66 of the light emission member form such a lens as being thicker as getting nearer to the center of the distal end portion 66 of the light emission member and thinner as getting nearer to its periphery.

The component of the photo-setting resin 54 is the same as that in the case of the fiber optic CRT shown in the above-mentioned second embodiment.

If the sensitivity of the photo-setting resin 54 differs with respect to each wave length, the sensitivity of the photo-setting resin 54 can be adapted to the brightness of the light emission member.

The light emission device or the optical signal transmission apparatus may be adapted for an optical information processing apparatus and is provided with a plurality of microlenses. The microlenses are formed of the photo-setting resin, and the microlenses are exposed by the light emitted form the light emission device and having an energy differing with respect to each wave length. Further, the photo-setting resin may have a sensitivity differing with respect to each wave length. The dimensions of the microlenses can be totally made equal so as to further improve the collection of the light.

FOURTH EMBODIMENT

Then, a fourth embodiment of the present invention concerning an optical signal transmission apparatus and an optical information processing apparatus will be explained with reference to FIG. 16 and 17 hereinafter.

Figure 16A:
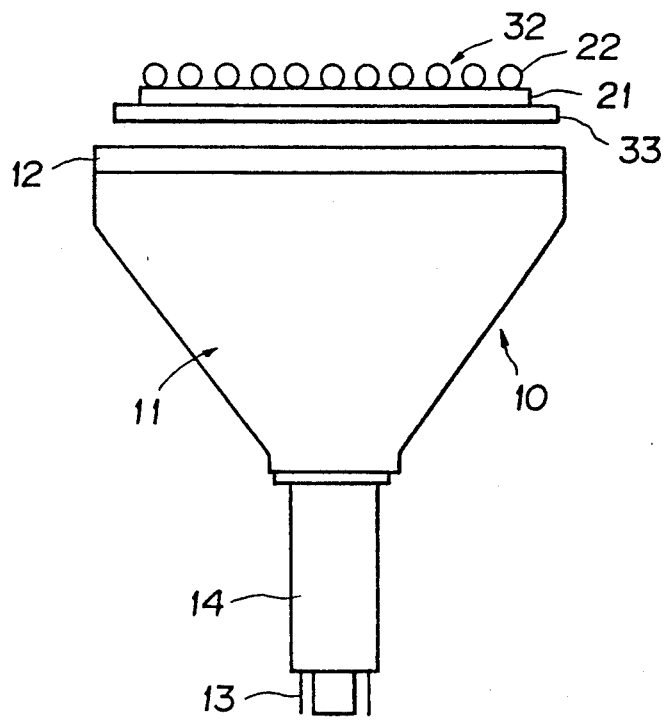
FIG. 16(a) and (b) are a front and a side views schematically showing a fiber optic CRT; respectively.

FIG. 16(a) and (b) are views showing a fiber optic CRT as an optical information processing apparatus.

Figure 16B:
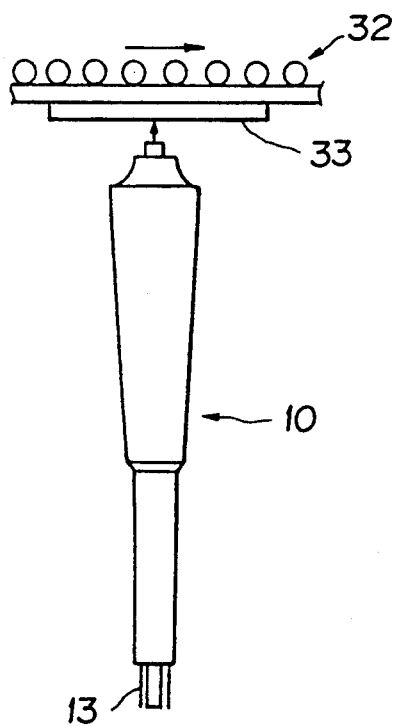

In FIG. 16(a), the fiber optic CRT is disposed in parallel with conveyance direction of the photosensitive/pressure-sensitive recording medium. FIG. 16(b) is a view in which it is viewed from the direction perpendicular to the conveyance direction.

As shown in FIGS. 16(a) and (b), an optical signal transmission apparatus 10 comprises a CRT section 11 and an optical fiber section 12 formed by the process shown in FIG. 11. A photosensitive/pressure-sensitive recording medium 32 is conveyed so as to run on a glass exposure table 33 on the light outputting side of a plurality of the optical fibers 11.

An image information is supplied as an electric signal so as to transmit from an electric signal input port 13 to the CRT section 11. The electric signal supplied to the CRT section 11 is converted to an electron beam, which runs through the Braun tube. Fluorescent materials having three kinds of colors R, G, B (not illustrated) are spread over the front surface of the CRT. When the electron beam is applied to the fluorescent materials, they illuminate respectively. The lights of the illuminated fluorescent materials pass through the optical fiber section 12 so that the photosensitive/pressure-sensitive recording medium 32 is irradiated therewith.

Figure 17:
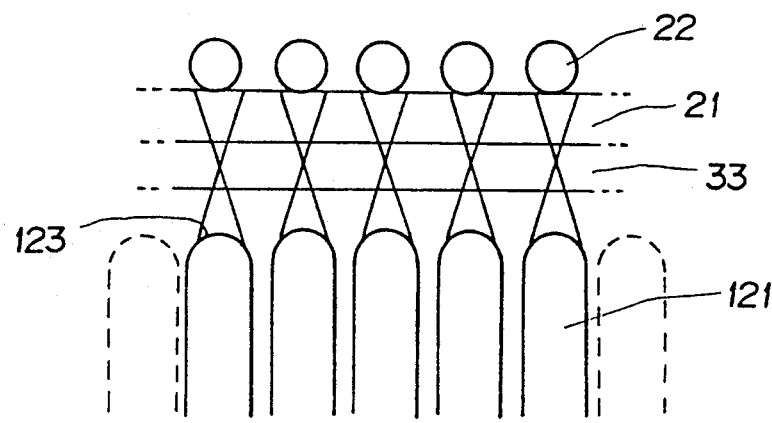
FIG. 17 is a schematic view showing a state in which a light outputted from the optical fiber forms an image.

FIG. 17 shows a state wherein a beam emitted from each optical fiber 121 is focused on the photosensitive/- pressure-sensitive recording medium 32 to form an image. An image information passing through the respective optical fibers 121 are outputted from the distal end portions 123 of the optical fibers 121. Since the distal end portion 123 of the optical fiber 121 is round, the light coming out of the center of the optical fiber 121 runs straight and the light coming out of its peripheral portion refracts toward the center of the optical fiber 121 so as to be focused on the microcapsules 22 after passing through the exposure table 3 and the base member 21 of the photosensitive/pressure-sensitive recording medium 32. The electoral signal supplied to the fiber optic CRT 10 is divided into R, G and B components, and there are also the fluorescent materials of three colors applied to the front surface of the CRT 11 and adapted to simultaneously illuminate respectively. The lights of the fluorescent materials simultaneously or selectively illuminated are outputted from the distal end of each optical fiber 121.

Figure 18:
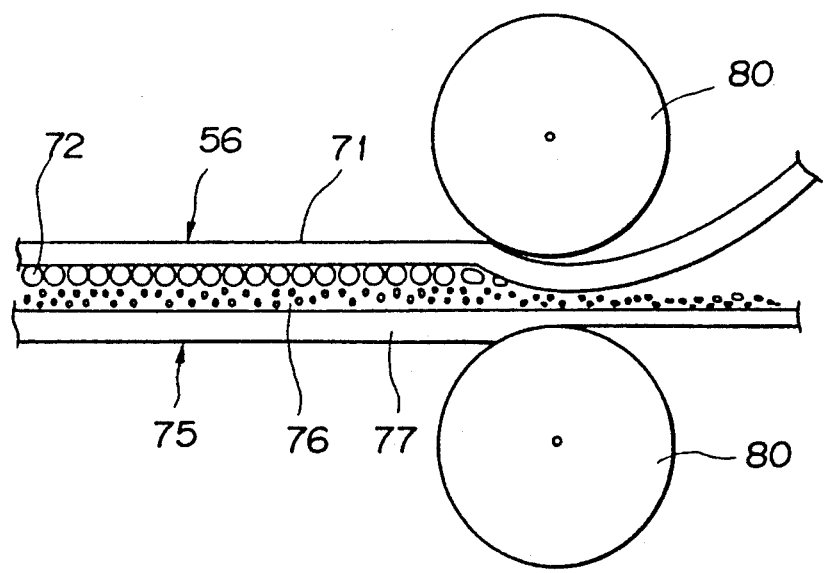
FIG. 18 is a schematic view showing a state in which an image is formed in a photosensitive/pressure-sensitive recording medium.

FIG. 18 shows a developing method of the photosensitive/pressure-sensitive recording medium 56. Each of microcapsules 72 supported on the base member 71 of the photosensitive/pressure-sensitive recording medium 56 accommodates a photopolymeric component substance to be solidified in response to light intensity. The microcapsules 72 are selectively solidified by the irradiation of the light through the above optical signal transmission apparatus. When the photosensitive/pressure-sensitive recording medium 56 is superimposed over a developing sheet 75 and then developed by pressure in a pressure development device 80, the microcapsules 72 are broken in accordance with solidification degrees. Thereby, dye precursors accommodated therewith in flow out and react with a developing agent 76 supported by a base member 77 of the developing sheet 75 to provide colors. When a latent image of the photosensitive/pressure-sensitive recording medium 56 is transferred to the developing sheet 75, the recording medium 56 is separated from the developing sheet 75 in a condition where the image is formed on the side of the developing sheet 75. The image formed according to this image formation method faithfully reproduces the inputted image information.

The optical signal transmission apparatus enables to expose the recording medium 32 by a non-contact method from the back surface as well as also from the front surface of the recording medium 32 and to expose the recording medium without damaging it. Further, the image outputted by the optical signal transmission apparatus of the present invention has no dim portion.

As clearly understood from the above description, according to the fourth embodiment, the light emitted from the optical fiber section 12 of the optical signal transmission apparatus can make an image at a certain focus (focusing distance). When a photosensitive/recording medium is irradiated therewith, it is possible to prevent a decrease of the light intensity because a light diffusion is not generated in any medium. Further, since a diameter of the light beam emitted from the optical fiber is smaller than that of the distal end of the optical fiber, a dim image is not totally made because the light does not expose a wide range of the photosensitive recording medium which should be exposed.

Besides, according to the fourth embodiment, since the microlenses are provided in the light emission device or in the optical signal transmission apparatus, advantageously a clear image can be provided due to the condensing property of the light in addition that the apparatus can be made small in dimension.

FIFTH EMBODIMENT

Then, a fifth embodiment of the present invention concerning an optical information processing apparatus formed by the method shown in FIGS. 15(a) through (c) will be explained with reference to FIGS. 19 through 21 hereinafter.

Figure 19A:
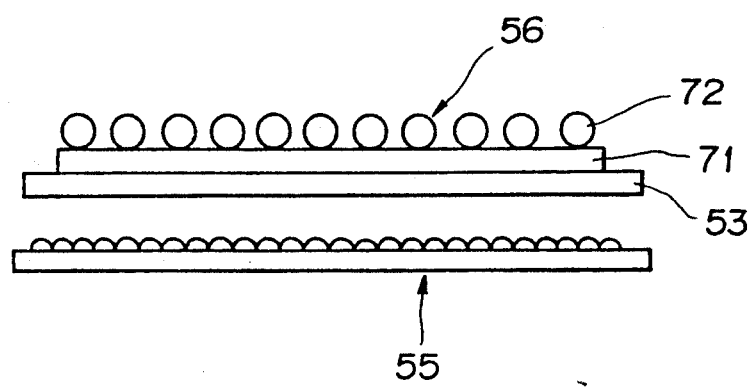
FIGS. 19(a) and 19(b) are views schematically showing a LED array.
Figure 19B:
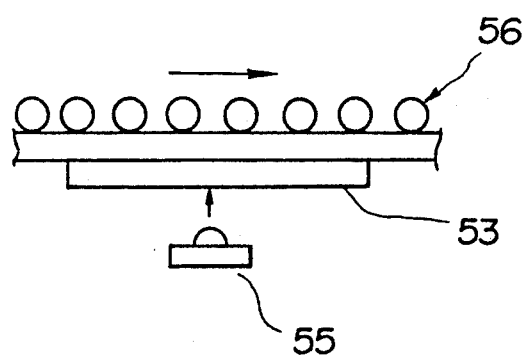
Figure 20:
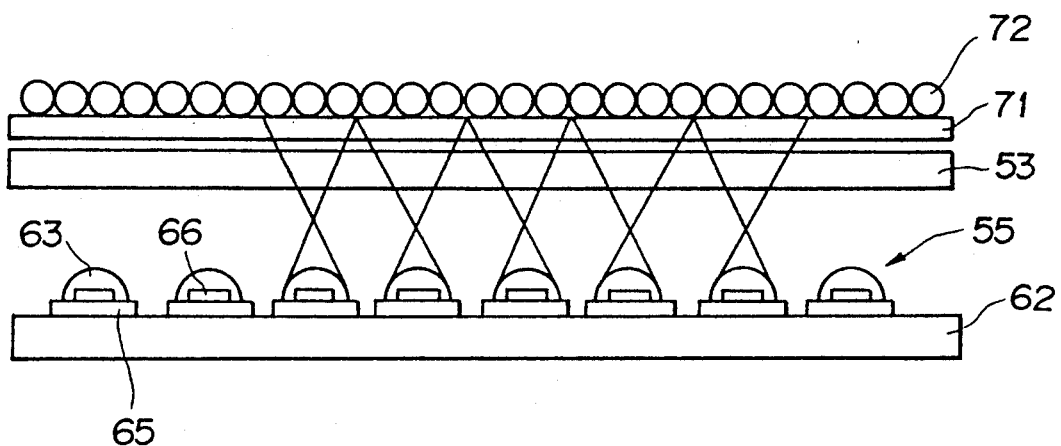
FIG. 20 is a schematic view showing a state in which a light outputted from the LED array forms an image.

FIGS. 19 and 20 are views showing an LED array as an optical information processing apparatus.

Figure 21:
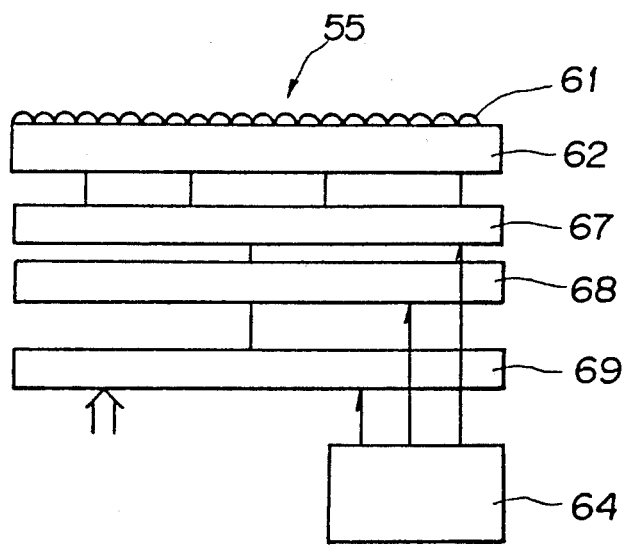
FIG. 21 is a view showing a drive circuit of the LED array.

As shown in FIGS. 19 through 21, an LED array 55 as a light emission device has a plurality of electrodes 65 arranged in a zigzag state on a GaAs base member 62 and the distal end portions 66 of the light emission device as light emission element formed on the respective electrodes 65. A microlens 63 is formed on the distal end portion 66. The light emitted from the distal end portion 66 runs straight at the center of the distal end portion 66 and refracts toward its center at the peripheral portion by the microlens 63. The light runs through an original table 53 and a base member 71 of the photosensitive and pressure-sensitive recording medium 56 so as to be focused on the microcapsules 72.

FIG. 21 is a view schematically showing a driving circuit of the LED array 55.

An image information is supplied as an electric signal, and a head control circuit 64 supplies a clock signal for image data sent in order to a shift resistor 69 so as to send image data enabling the LED array 55 to once emit a light. The image data within the shift resistor 69 is transferred to a latch 68 in response to a strobe-signal from the head control circuit 64.

The shift resistor 69 which has transferred the image data to the latch 68 takes in the image data again in response to the clock signal of the head control circuit 64. The head control circuit 64 drives a driver 67 according to the image data of the latch 68 and performs a switching control of the LED array 55 so that the light emission device 61 performs the light emission according to the image data.

As explained above, since the microlenses are attached to the distal end portions of the light emission member 61 of the LED array in the fifth embodiment, the apparatus can be made small in dimension in comparison with a conventional one provided with a Selfoc lens. The image becomes clear due to the condensing property of the light. Further, the LED array 55 can perform a non-contact exposure not only from the back surface of the photosensitive/pressure-sensitive recording medium 56 but also from the front surface thereof in addition that the exposure of the image information is performed without damaging the photosensitive/pressure-sensitive recording medium 56.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and scope of equivalency of the claims are therefore intended to be embraced therein.

For example, in the first embodiment, a laser may be used instead of the diffused light to variously modify the shape of lens.

Further, when the intensity distribution of the light outputted from the optical fiber is optionally set, the lens shape, of course, can be optically changed.

Incidentally, through the second and fifth embodiment employs the LED array, it is not limited thereto. The microlens 63 may be formed at the distal end portion of a light emission member such an element as illuminating by itself such as an electro-luminescence, a plasma light emission and so on when an electric signal is applied thereon.

What is claimed is:

1. A method for forming a lens at an end portion of an optical fiber, which comprises the steps of:
   dipping one end of the optical fiber into an unsolidified photo-setting resin; and
   solidifying the photo-setting resin adjacent to said one end of the optical fiber by exposing said adjacent photo-setting resin by a light which is transmitted through the optical fiber and outputted from said one end while said one end is disposed in said unsolidified photo-setting resin.

2. A method for forming a lens at an end portion of an optical fiber according to claim 1, wherein the lens formed at the one end of the optical fiber is formed into a convex lens because of an intensity distribution of the light inputted from the one end thereof.

3. A method for forming a lens at an end portion of an optical fiber according to claim 1, wherein a plurality of optical fibers are arranged in a predetermined configuration, and one ends of these optical fibers are simultaneously dipped into the unsolidified photo-setting resin.

4. A method for forming a lens at an end portion of an optical fiber according to claim 2, wherein the lens is formed by exposing the photo-setting resin which has a different photosensitive with respect to a wavelength of a light having a different energy with respect to each wavelength.

5. A method for forming a lens at an end portion of an optical fiber according to claim 2, wherein the lens is formed of the photo-setting resin which has a different photosensitivity with respect to each wavelength in a fiber optical CRT whose brightness differs with respect to each wavelength of a light therefrom.

6. A method for forming a lens array at an end portion of an LED array, which comprises the steps of:
   dipping the end portion of the LED array into an unsolidified photo-setting resin;
   solidifying the photo-setting resin adjacent to said end portion of the LED array by exposing said adjacent photo-setting resin by a light which is generated by the LED array and outputted from said end portion thereof while said one end is disposed in said unsolidified photo-setting resin.

7. A method for forming a lens at an end portion of an LED array according to claim 6, wherein each lens formed at the one end of the LED array is formed into a convex lens because of an intensity distribution of the light inputted from the one end thereof.

8. A method for forming a lens at an end portion of an LED array according to claim 7, wherein the lens is formed by exposing the photo-setting resin which has a different photosensitivity with respect to a wavelength of a light having a different energy with respect to each wavelength.

9. A method for forming a lens at an end portion of an LED array according to claim 7, wherein the lens is formed of the photo-setting resin which has a different photosensitivity with respect to each wavelength in the fiber optic CRT whose brightness differs with respect to each wavelength of a light therefrom.

10. A method for forming a lens array at an end portion of an LED array according to claim 7, wherein the lens is formed by exposing the photo-setting resin which has a different photosensitivity with respect to a wavelength of a light having a different energy with respect to each wavelength.

11. A method for forming a lens array at an end portion of an LED array according to claim 7, wherein the lens is formed of the photo-setting resin which has a different photosensitivity with respect to each wavelength in a fiber optic CRT whose brightness differs with respect to each wavelength of a light emitted therefrom.

* * * * *